United States Patent [19]

Wong et al.

[11] Patent Number: 5,801,561
[45] Date of Patent: Sep. 1, 1998

[54] POWER-ON INITIALIZING CIRCUIT

[75] Inventors: Keng L. Wong; Gregory F. Taylor; Roshan J. Fernando, all of Portland; Jeffrey E. Smith, Aloha, all of Oreg.

[73] Assignee: Intel Corporation, Santa Clara, Calif.

[21] Appl. No.: 842,501

[22] Filed: Apr. 21, 1997

Related U.S. Application Data

[63] Continuation of Ser. No. 431,897, May 1, 1995, abandoned.

[51] Int. Cl.⁶ .................................................. H03K 17/22
[52] U.S. Cl. .................................. 327/143; 327/198
[58] Field of Search ............................. 327/99, 143, 198, 327/407

[56] References Cited

U.S. PATENT DOCUMENTS

| | | | |
|---|---|---|---|
| 4,045,692 | 8/1977 | Morokawa et al. | 307/279 |
| 4,103,187 | 7/1978 | Imamura | 307/251 |
| 4,140,930 | 2/1979 | Tanaka | 307/362 |
| 4,367,422 | 1/1983 | Leslie | 307/597 |
| 4,385,243 | 5/1983 | Suzuki | 307/350 |
| 4,558,233 | 12/1985 | Nakamori | 307/362 |
| 4,594,518 | 6/1986 | Pollachek | 307/350 |
| 4,607,178 | 8/1986 | Sugie et al. | 307/362 |
| 4,686,383 | 8/1987 | Croft | 307/200 |
| 4,788,454 | 11/1988 | Tanagawa et al. | 307/296 |
| 4,815,041 | 3/1989 | Baylock | 365/233 |
| 4,886,984 | 12/1989 | Nakaoka | 327/143 |
| 4,968,899 | 11/1990 | Katsutani et al. | 327/99 |
| 4,982,116 | 1/1991 | Lee | 327/144 |
| 5,155,380 | 10/1992 | Hwang et al. | 327/99 |
| 5,172,330 | 12/1992 | Watanabe et al. | 364/491 |
| 5,227,672 | 7/1993 | Sawtell | 327/141 |
| 5,303,350 | 4/1994 | Yu et al. | 327/198 |
| 5,369,377 | 11/1994 | Benhamida | 331/49 |
| 5,402,390 | 3/1995 | Ho et al. | 327/44 |
| 5,446,404 | 8/1995 | Badyal et al. | 327/143 |
| 5,473,768 | 12/1995 | Kimura | 395/550 |

FOREIGN PATENT DOCUMENTS

| | | |
|---|---|---|
| 0025194 | 8/1980 | European Pat. Off. . |
| 0359177 | 3/1990 | European Pat. Off. . |
| 0621695 | 10/1994 | European Pat. Off. ............... 327/198 |
| 4-361422 | 12/1992 | Japan ................................. 327/143 |
| 2236415 | 4/1991 | United Kingdom . |
| 2108342 | 5/1993 | United Kingdom . |
| 8605933 | 10/1986 | WIPO . |

*Primary Examiner*—Terry Cunningham
*Attorney, Agent, or Firm*—Blakely, Sokoloff, Taylor & Zafman

[57] ABSTRACT

A method and apparatus for reducing contention in an integrated circuit during power-up. According to one aspect of the invention, an initialization circuit is included in an integrated circuit. In response to receiving Vcc, the initialization circuit generates a substitute clock signal and a substitute reset signal. The substitute clock signal and substitute reset signal are substituted for an off chip generated clock signal and an off chip generated reset signal during power-up until a predetermined condition is met. In response to receiving the substitute clock signal and the substitute reset signal, a plurality of circuits on said integrated circuit are initialized.

17 Claims, 3 Drawing Sheets

POWER-ON INITIALIZING CIRCUIT

This is a continuation of application Ser. No. 08/431,897, filed May 1, 1995, now abandoned.

BACKGROUND OF THE INVENTION

1. Field of the Invention

The present invention relates to the field of electronic devices. More specifically, the present invention relates to the reduction of contention during power-up of electronic devices.

2. Background Information

Each time power is supplied to an electronic device (e.g., a computer system), chips in the electronic device (e.g., a processor) undergo an initialization sequence to initialize their various state machines (e.g., multiplexors and bus drivers). One prior art method for performing this initialization sequence uses the reset signal and a predetermined number of clock signals. However, many electronic devices generate the clock signal and the reset signal using circuits external to the various chips requiring initialization. As a result, different schemes for delivering power (i.e., Vcc), the clock signal, and the reset signal to the chips in an electronic device have evolved.

For example, one such scheme supplies Vcc as it ramps-up, but waits a predetermined period of time after Vcc has reached its normal operating level before supplying the clock signal. Under such a scheme, Vcc reaches its normal operating level (e.g., 3.3 volts) prior to the initialization of the state machines in these chips—i.e., prior to the receipt of the predetermined number of clock signal cycles. As a result, this approach suffers from contention when the un-initialized drivers try to pull signals in different directions. The potential damage caused by this contention depends on two factors: 1) the amount of power supplied prior to initialization of the state machines; and 2) the duration this contention exists in the circuit. Currently, typical chips are sufficiently robust and their operating power is sufficiently low such that no damage results from this contention. However, as the size of devices in chips is decreased and the transconductance is increased, this contention can cause damage.

A second scheme provides Vcc and the clock signal to the chips as Vcc and the clock signal are generated (i.e., as they are ramping up). Since the generation of the clock signal is typically driven by the same power supply driving Vcc, the clock signal may not be able to toggle as Vcc ramps up. As a result, the previously mentioned damaging contention can again exist if Vcc reaches a sufficiently high level prior to these chips receiving the necessary number of clock signal cycles—i.e., prior to the initialization of the state machines in these chips.

A third scheme uses a separate power supply to drive the generation of the clock signal, and supplies that clock signal prior to or as Vcc is ramping up. This approach risks causing the chips to latch up as the clock high level greatly exceeds the initial value of Vcc.

Additional problems with these schemes result from the use of the reset signal. Typically, the reset signal is buffered by a synchronization circuit contained on the integrated circuit. Since the synchronization circuit typically uses two cycles of the clock signal to synchronize the reset signal, the reset signal is received by the state machines sometime after receipt of the clock signal. Since the initialization of the state machines in the integrated circuit requires both the reset signal and the clock signal, the initialization of the state machines is further delayed by this synchronization. This results in greater contention and/or potential for latch-up during power-up.

SUMMARY

A method for reducing contention in an integrated circuit during power-up is provided. According to one aspect of the invention, an initialization circuit is included in an integrated circuit. In response to receiving Vcc, the initialization circuit generates a substitute clock signal and a substitute reset signal. The substitute clock signal and substitute reset signal are substituted for an off chip generated clock signal and an off chip generated reset signal during power-up until a predetermined condition is met. In response to receiving the substitute clock signal and the substitute reset signal, a plurality of circuits on said integrated circuit are initialized.

According to another aspect of the present invention, an apparatus for reducing contention in an integrated circuit is provided. The apparatus generally includes a first circuit which generates a substitute clock signal and a substitute reset signal in response to receiving a power signal. The first circuit also substitutes the substitute clock signal for an off chip generated clock signal and the substitute reset signal for an off chip generated reset signal upon receiving the power signal and until a predetermined condition is met. The integrated circuit also includes a second circuit having a clock input coupled to said first circuit to receive either of said substitute clock signal and said off chip generated clock signal. The second circuit also has a reset input coupled to said first circuit to receive either of said substitute reset signal and said off chip generated reset signal.

BRIEF DESCRIPTION OF THE DRAWINGS

The invention may best be understood by referring to the following description and accompanying drawings which illustrate the invention. In the drawings.

DETAILED DESCRIPTION

In the following description, numerous specific details are set forth to provide a thorough understanding of the present invention. However, it is understood that the present invention may be practiced without these specific details. In other instances, well-known circuits, structures and techniques have not been shown in detail in order not to unnecessarily obscure the present invention.

Although a more detailed description will be provided below, it is thought worthwhile to provide a brief overview of the present invention. This application describes a method and apparatus for reducing contention and preventing latch-up in an integrated circuit during power-up.

Overview

In one embodiment, an integrated circuit is implemented to include an initialization circuit. During power-up, the initialization circuit blocks any externally generated clock signal asserted at its clock terminal, generates a substitute clock signal, and asserts the substitute clock signal at the clock inputs of the un-initialized state machines in the integrated circuit. In addition, the initialization circuit jams any externally generated reset signal asserted at its reset signal, and asserts the substitute reset signal at the reset inputs of the state machines. At some point after the state machines have been sufficiently reset, the initialization circuit switches to supply the externally generated clock and reset signals (received at the clock and reset terminals of the integrated circuit) to the clock and reset terminals of the state machines.

The initialization circuit generates the substitute clock and reset signals on chips using Vcc as it ramps up, and thus, the substitute clock and reset signals are generated at low power levels. As a result, contention is reduced because the state machines are initialized at low power levels and the period of time during which contention can exist in the integrated circuit is shorter. For example, if an integrated circuit containing this initialization circuit is used in an electronic device which supplies Vcc as it ramps-up and which waits a predetermined period of time after Vcc has reached its normal operating level before supplying the clock signal, the initialization circuit initializes the state machines well before the clock signal is supplied. Thus, the power level at which the state machines are initialized is reduced and the period of time during which contention could exist in the integrated circuit is reduced.

One Embodiment of the Present Invention

Figure 1:
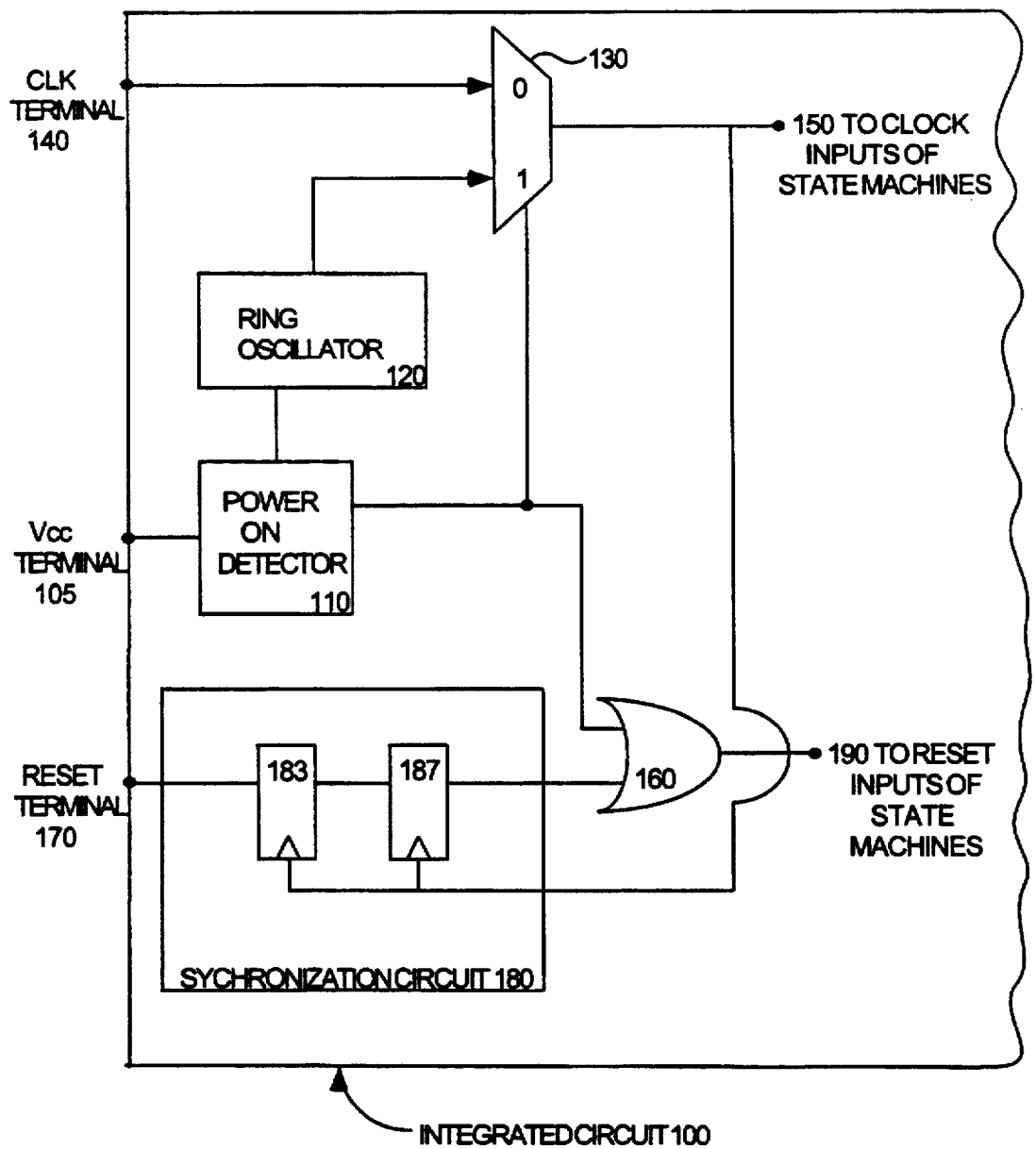
FIG. 1 illustrates an exemplary computer system incorporating the teachings of the present invention.

Referring now to FIG. 1, a block diagram illustrating an integrated circuit 100 incorporating the teachings of the present invention is shown. Integrated circuit 100 includes a clock terminal 140, a Vcc terminal 105, and a reset terminal 170. Clock terminal 140 is for receiving an externally generated clock; Vcc terminal 105 is used for receiving an externally generated power signal; and reset terminal 170 is used for receiving an externally generated reset signal. Techniques for generating such clock, power, and reset signals are well known in the prior art.

Integrated circuit 100 also includes a power-on detector 110, a ring oscillator 120, and an OR gate 160. Power-on detector 110 passes the power signal (i.e., logic 1) asserted at Vcc terminal 105 to ring oscillator 120, multiplexor 130, and OR gate 160 while the power signal is ramping up. When the power signal reaches a predetermined level, power-on detector 110 terminates the passing of the power signal, thus sending logic 0 to ring oscillator 120, multiplexor 130, and OR gate 160. Power-on detector circuits are well known in the prior art, and therefore will not be further described here so as to not obscure the present invention. As will be further described below, the passage of the power signal by power-on detector 110 is used for controlling the generation of the substitute clock and reset signals, as well as blocking the externally generated clock signal. Since a limited number of clock cycles (in one implementation this number is 15) are required to sufficiently initialize the state machines on integrated circuit 100, the substitute clock signal and the substitute reset signal need only be generated for a sufficient period of time to deliver the required number of clock cycles. Thus, the predetermined power level which power-on detector 110 terminates passing the power signal to ring oscillator 120, multiplexor 130, and OR gate 160 is selected such that the required number of clock cycles will be generated. While one embodiment is described in which a power-on detector is used to determine the number of substitute clock cycles to be generated, alternative embodiments could use any number of techniques. For example, an alternative embodiment could be implemented to count the number of substitute clock cycles and terminate substitution of the substitute clock signal after the required number of cycles had been generated.

In response to receiving the power signal from power-on detector 110, ring oscillator 120 generates the substitute clock signal. Once the state machines are initialized (i.e., when power-on detector 110 terminates passage of the power signal), ring oscillator 120 will shut off to conserve power. In one embodiment, ring oscillator 120 comprises a NAND gate and an even number of serially coupled inverters. One input of the NAND gate is coupled to receive the power signal from power-on detector 110, while the other input of the NAND gate is coupled to the output of the serially coupled inverters. The output of the NAND gate is coupled to the input of the serially coupled inverters to form a loop. The output of the serially coupled inverters is additionally used as the output of ring oscillator 120—i.e., the substitute clock signal. While one embodiment is described in which ring oscillator 120 is implemented using a NAND gate and several inverters, alternative embodiments could use any number of other devices.

The selectable inputs of multiplexor 130 are the substitute clock signal generated by ring oscillator 120 and the externally generated clock signal asserted at clock terminal 140. The control input of multiplexor 130 is coupled to power-on detector 110 for receiving the passed through power signal. When the power signal is passed through power-on detector 110, multiplexor 130 transmits the substitute clock signal to a node 150. However, when the power signal is not passed through power-on detector 110, multiplexor 130 transmits the substitute clock signal to node 150. From node 150, the currently selected one of the externally generated clock signal and the substitute clock signal is transmitted to the clock inputs of the state machines in integrated circuit 100.

As previously described, the power signal passed through power-on detector 110 is received at one input of OR gate 160. This power signal acts as the substitute reset signal. The other input of OR gate 160 receives the externally generated reset signal asserted at reset terminal 170 after that signal is synchronized by synchronization circuit 180—i.e., the output of multiplexor 130 (i.e., either the externally generated clock signal or the substitute clock signal) is received by clock input of synchronization circuit 180 to clock synchronization circuit 180. The output of OR gate 160 is coupled to node 190. The reset inputs of the state machines in integrated circuit 100 are coupled to node 190. Thus, OR gate 160 transmits a logic 1 signal to the reset input of the state machines in integrated circuit 100 when OR gate 160 receives either a logic 1 substitute reset signal or a logic 1 externally generated reset signal.

In this manner, the circuit shown in FIG. 1 will supply the substitute clock and reset signals as soon as the power reaches a sufficient level to generate those signals. In addition, the circuit conserves power by terminating the generation of the substitute clock signal after the state machines have been initialized. As a result, the circuit shown in FIG. 1 reduces contention by initializing the state machines in integrated circuit 100 at a low power level and soon after power is supplied. In addition, the circuit shown in FIG. 1 blocks the externally generated clock signal received at terminal 140 while the substitute clock signal is being used to initialize the state machines in integrated circuit 100. Furthermore, contention is further reduced because receipt of the substitute reset signal is not delayed by a synchronization circuit.

Figure 2:
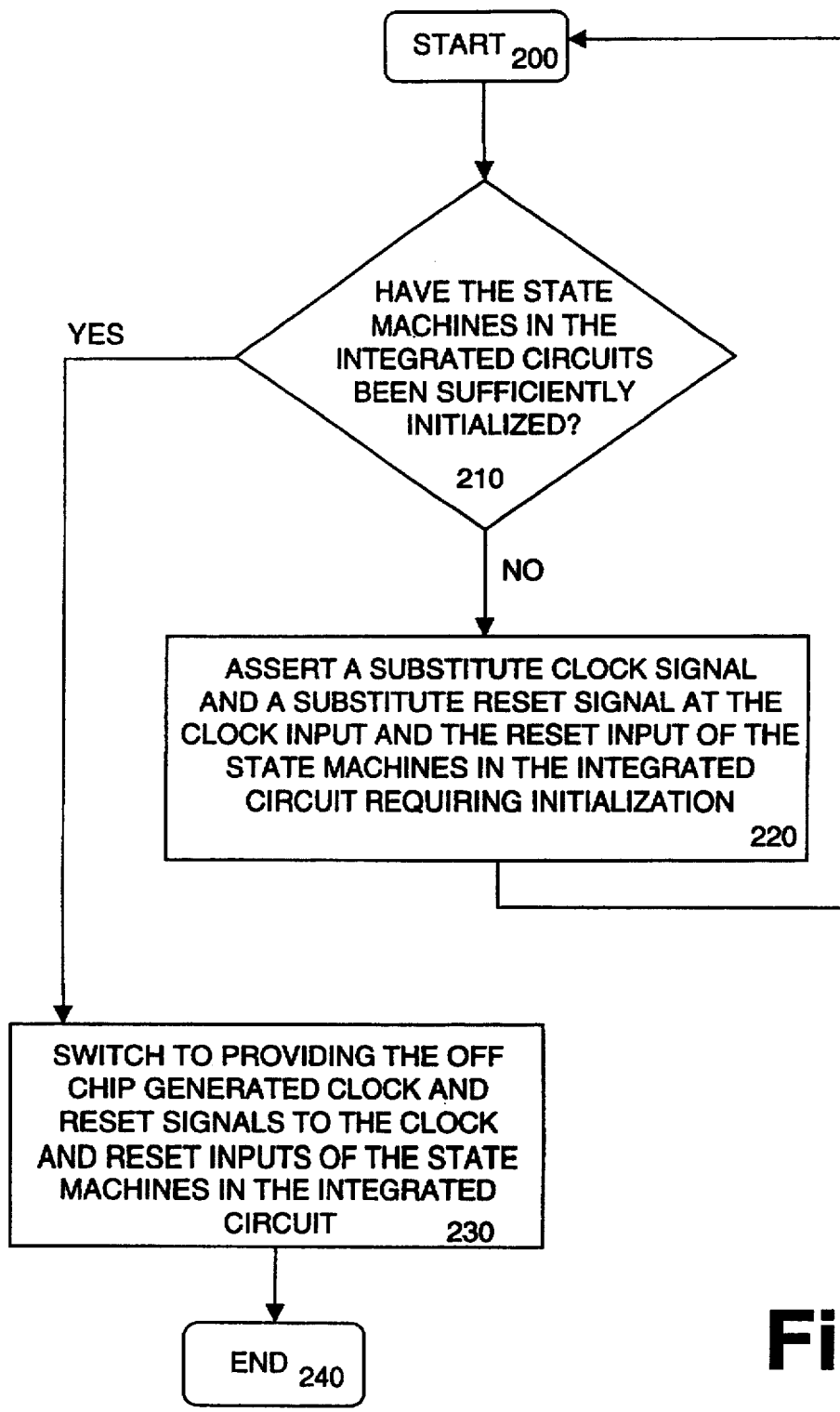
FIG. 2 illustrates a flow diagram illustrating the operation of one embodiment of the present invention.

Referring now to FIG. 2, a flow diagram illustrating the operation of one embodiment of the present invention is shown. At block 210, it is determined whether the state machines in the integrated circuit have been sufficiently initialized. If the state machines in the integrated circuit have not been sufficiently initialized, flow passes to block 220. Otherwise, flow passes to block 230. As previously described, in one embodiment power-on detector circuit 110 is used for making this termination.

As shown in step 220, a substitute power signal and a substitute reset signal are asserted at the clock input and the reset input of each state machine requiring initialization in place of the externally generated clock signal and the externally generated reset signal. From block 220, flow passes back to block 210.

At step 230, the integrated circuit switches to provide the off chip generated clock and reset signals to the clock and reset inputs of the state machines in the integrated circuit.

An Alternative Embodiment of the Present Invention

Figure 3:
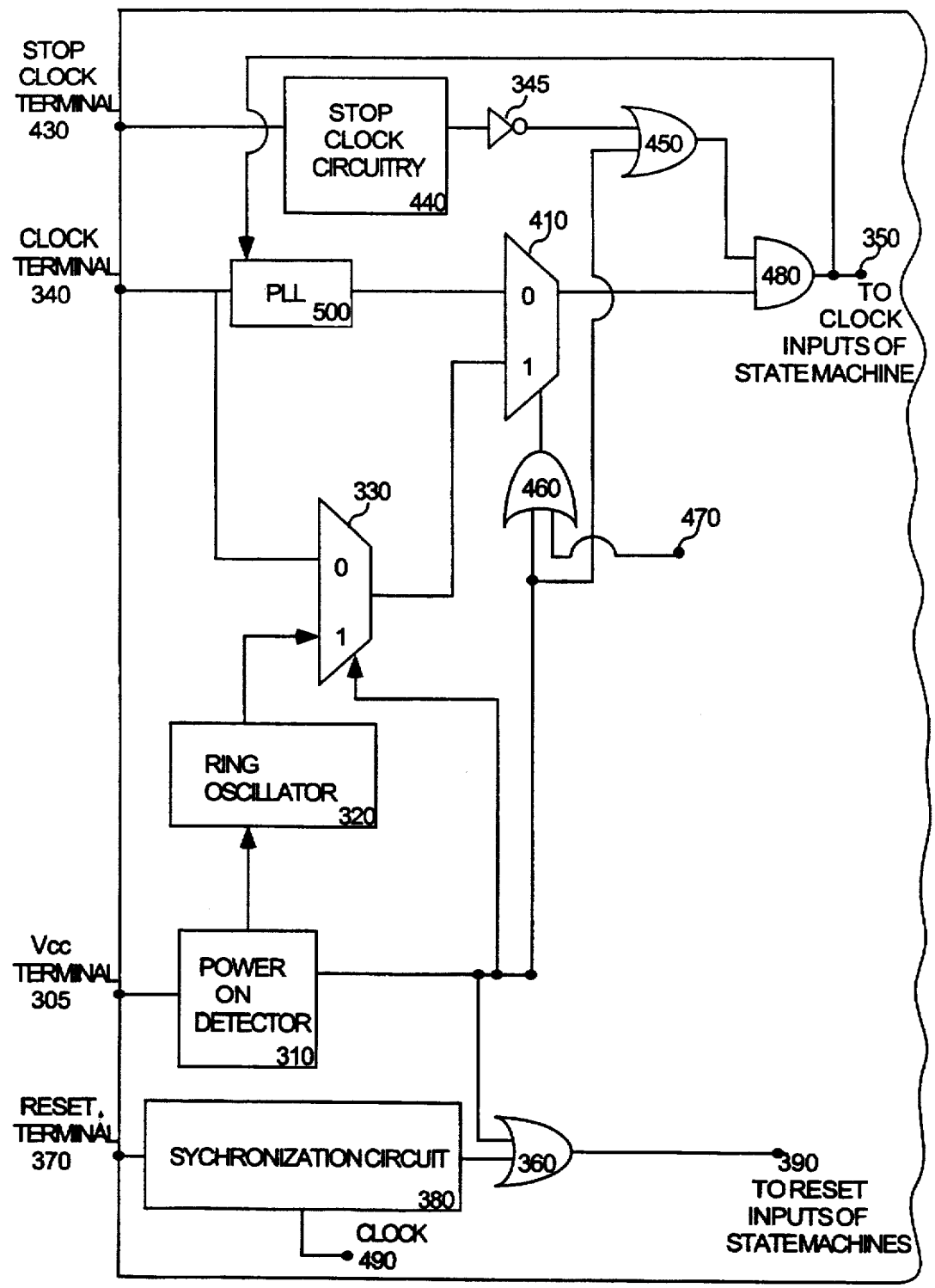
FIG. 3 illustrates an alternative embodiment of the present invention.

Referring now to FIG. 3, an alternative embodiment of the present invention is shown. FIG. 3 shows an integrated circuit 400 containing an initialization circuit similar to the embodiment shown in FIG. 1. Like integrated circuit 100, integrated circuit 400 has a clock terminal, a power terminal, and a reset terminal (i.e., clock terminal 340, Vcc terminal 305, and reset terminal 370) for receiving an externally generated clock signal, power signal, and reset signal, respectively. Integrated circuit 400 also includes a ring oscillator 320, a power-on detector 310, a synchronization circuit 380, and an OR gate 360. Ring oscillator 320, power-on detector 310, synchronization circuit 380, and OR gate 360 are coupled together in the same manner as ring oscillator 120, power-on detector 110, synchronization circuit 180, and OR gate 160.

Synchronization circuit 380 is clocked by a clock signal asserted at node 490. This clock signal is preferably generated using the externally generated clock signal received at clock terminal 340.

Integrated circuit 400 also includes a multiplexor 330. Multiplexor 390 is similar to multiplexor 130 in that the selectable inputs of multiplexor 330 receive both the substitute clock signal generated by ring oscillator 320 and the externally generated clock signal received at clock terminal 340. In addition, the control input of multiplexor 330 is coupled to the power signal passed through power-on detector 310. Thus, multiplexor 330 transmits the substitute clock signal when the power signal is passed through power-on detector 310 and transmits the externally generated clock signal when the power signal is not passed through power-on detector 310. However, unlike multiplexor 130, the output of multiplexor 330 is coupled to one of the inputs of a multiplexor 410.

The other input of multiplexor 410 receives the externally generated clock signal asserted at clock terminal 340 after it has passed through a PLL 500. PLL 500 allows the externally generated clock signal to be delivered with effectively zero delay (be deskewed). The control input of multiplexor 410 is coupled to the output of an OR gate 460. One of the inputs of OR gate 460 is coupled to power-on detector 310 to receive the power signal. The other input of OR gate 460 is coupled to a node 470 at which a bypass control signal is asserted. In operation, multiplexor 410 transmits the substitute clock signal received from multiplexor 330 when the power signal is passed through by power-on detector 310. However, multiplexor 410 transmits the externally generated clock that has not passed through PLL 500 when the by pass control signal is asserted as logic 1 and the power signal is not being passed through by power-on detector 310. Thus, by using the bypass control signal, the PLL may be removed from the circuit for test and debug purposes. In contrast, multiplexor 410 transmits the externally generated clock signal which has passed through PLL 500 during normal operation—i.e., when both the inputs to OR gate 460 are logic 0.

Thus, during power-up, the described circuit transmits the substitute clock signal to the clock inputs of the state machines. However, during normal operation, the described circuit allows for the transmission of either the externally generated clock signal as it is received at clock terminal 340 or the externally generated clock signal after it has passed through PLL 500.

Also unlike integrated circuit 100, integrated circuit 400 includes additional circuitry to block the externally generated clock signal in response to receiving a logic 1 signal at stop clock terminal 430. Thus, this circuitry allows the clock that is distributed through the chip to be blocked, saving power when integrated circuit 100 is not needed. This circuitry includes stop clock circuitry 440, an inverter 345, an OR gate 450, and an AND gate 480. Stop clock circuitry 440 is coupled to stop clock terminal 430 for receiving a stop clock signal. The output of stop clock circuitry 440 passes through an inverter 345 to the input the two input OR gate 450. The other input of OR gate 450 is the power signal passed through by power-on detector 310. This signal has the same characteristics as the other signals generated by power-on detector 310 previously described. The output of OR gate 450 is coupled to the input of AND gate 420. The other input of AND gate 420 receives the output of multiplexor 410. The output of AND gate 420 is transmitted to node 350—i.e., to the state machines requiring initialization in integrated circuit 400.

In operation, when either the stop clock signal is asserted as logic 0 at stop clock terminal 430 or the power signal is allowed to pass through power-on detector 310, any clock signal asserted at AND gate 480 will be transmitted to the state machines on integrated circuit 400. Thus, the initialization signals (i.e., the substitute clock and reset signals) generated by the circuit shown in FIG. 3 take precedence over the stop clock signal. However, after initialization (i.e., after the power-on detector terminates passage of the power signal), the stop clock signal can be asserted as logic 1 to block the transmission of the externally generated clock signal—i.e., when the stop clock signal is logic 1 and power-on detector 310 is not allowing the power signal to pass, the input to AND gate 480 is logic 0.

Thus, the integrated circuit in FIG. 3 is implemented such that when logic 1 is received at stop clock terminal 430, the externally generated clock is blocked from reaching node 350. However, the substitute clock signal is not blocked from reaching node 350 during power-up.

Alternative Embodiments

While the present invention has been described in terms of several embodiments, those skilled in the art will recognize that the invention is not limited to the embodiments described. The method and apparatus of the present invention can be practiced with modification and alteration within the spirit and scope of the appended claims. The description is thus to be regarded as illustrative instead of limiting on the present invention.

What is claimed is:

1. An integrated circuit requiring a clock signal, said integrated circuit comprising:
   a fist terminal for receiving an external clock signal;
   a second terminal for receiving a power signal;

a first means, coupled to receive said power signal, for generating an internal clock signal; and a second means coupled to receive said external clock signal, said internal clock signal, and said power signal, said second means for providing at a first output said internal clock signal while a predetermined condition is not met, and for providing said external clock signal at first output after said predetermined condition is met wherein said predetermined condition corresponds to said power signal reaching a predetermined level.

2. The integrated circuit of claim 1, wherein said second means further comprises means for detecting said predetermined level.

3. The integrated circuit of claim 2, wherein said second means provides at a second output said power signal as a reset signal while said predetermined condition is not met.

4. The integrated circuit of claim 1, wherein said second means comprises means for detecting a predetermined period of time has expired, said power signal reaching said predetermined level within said predetermined period of time.

5. An integrated circuit requiring a clock signal, said integrated circuit comprising:

a substitute clock signal generation circuit;

a clock signal selection circuit having a control input for receiving a control signal, said clock signal selection circuit having a first input configured to receive an off chip generated clock signal and a second input configured to receive a substitute clock signal generated by said substitute clock signal generation circuit, and an output for providing one of said off generated clock signal and said substitute clock signal based on said control signal; and a circuit coupled to said control input, said circuit provide said control signal such that said substitute clock signal is provided at said output of said clock signal selection circuit while a predetermined condition is not met, said predetermined condition corresponding to said power signal reaching a predetermined level.

6. The integrated circuit of claim 5, wherein said circuit is a power-on detector.

7. The integrated circuit of claim 5, wherein said circuit is logic for detecting when a predetermined number of cycles of said internal clock signal have been generated, said predetermined condition being met when said predetermined number of cycles of said internal clock signal have been generated.

8. The integrated circuit of claim 5, further comprising:

a reset synchronization circuit having an input that is configured to receive an off chip generated reset signal; and an OR gate having a first input configured to receive said control signal provided by said circuit, a second input coupled to said output of said reset synchronization circuit, and an output.

9. An integrated circuit comprising:

a power-on detector coupled to receive a power signal, said power-on detector having an output for providing said power signal until said power signal reaches a predetermined level;

an oscillator operatively coupled to receive said power signal, said oscillator generating and transmitting a substitute clock signal in response to receiving said power signal; and a multiplexor coupled to receive said substitute clock signal and configured to receive a clock signal based on an externally generated clock signal received by said integrated circuit, said multiplexor having a control input coupled to said output of said power on detector, said multiplexor providing said substitute clock signal while said power-on detector provides said power signal at said output.

10. The integrated circuit of claim 9, further comprising:

a synchronization circuit coupled to receive and transform an externally generated reset signal into a synchronized reset signal; and an OR gate coupled to receive as inputs said synchronized reset signal provided by said synchronization circuit and said power signal provided by said power-on detector, said OR gate having an output.

11. A method for reducing contention in an integrated circuit during power-up, said method comprising the steps of:

generating an internal clock signal in response to receiving a power signal supplied to said integrated circuit;

providing said internal clock signal at a first output in said integrated circuit; and switching from providing said internal clock signal to providing an externally generated clock signal received by said integrated circuit in response to said power signal reaching a predetermined level.

12. The method of claim 11, further comprising the steps of:

providing said power signal at a second output in said integrated circuit until said power signal reaches said predetermined level.

13. The method of claim 11, further comprising the step of:

terminating generation of said internal clock signal in response to said power signal reaching said predetermined level.

14. In an integrated circuit, a method for reducing contention in said integrated circuit during power-up, said method comprising the steps of:

generating a substitute clock signal in response to receiving a power signal;

providing said substitute clock signal at a first output in said integrated circuit until a predetermined condition is met, said predetermined condition corresponding to said power signal reaching a predetermined level;

receiving an external clock signal generated exterior to said integrated circuit; and switching to providing said external clock signal at said first output subsequent to said predetermined condition being met.

15. The method of claim 14 further comprising the steps of:

providing said power signal at a second output in said integrated circuit until said predetermined condition is met; and Initializing a plurality of circuits in said integrated circuit in response to receiving said substitute clock signal and said power signal at said first output and said second output, respectively.

16. The method of claim 15, further comprising the step of providing a synchronized reset signal at said second output in response to said integrated circuit receiving an externally generated reset signal.

17. The method of claim 14, wherein said step of switching to providing said external clock signal further includes deskewing said external clock signal prior to providing said external clock signal at said first output.

* * * * *